United States Patent
Rahim et al.

(10) Patent No.: US 6,476,635 B1
(45) Date of Patent: Nov. 5, 2002

(54) PROGRAMMABLE NUMBER OF METAL LINES AND EFFECTIVE METAL WIDTH ALONG CRITICAL PATHS IN A PROGRAMMABLE LOGIC DEVICE

(75) Inventors: Irfan Rahim, Milpitas, CA (US); John E. Berg, Palo Alto, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/604,992

(22) Filed: Jun. 28, 2000

(51) Int. Cl.⁷ .............................................. H03K 19/177
(52) U.S. Cl. .............................. 326/41; 326/39; 326/40; 326/113
(58) Field of Search ............................ 326/39, 40, 41, 326/113

(56) References Cited

U.S. PATENT DOCUMENTS 4,567,385 A * 1/1986 Falater et al. .................. 326/33
4,857,774 A * 8/1989 El-Ayat et al. ................. 326/16
5,615,216 A * 3/1997 Saeki ........................... 714/724
5,910,732 A * 6/1999 Trimberger ..................... 326/38
6,160,420 A * 12/2000 Gamal et al. ................... 326/41
6,239,615 B1 * 5/2001 Ngai et al. ..................... 326/41
6,246,265 B1 * 6/2001 Ogawa ........................... 326/95

* cited by examiner

Primary Examiner—Michael G. Lee
Assistant Examiner—Steven S. Paik
(74) Attorney, Agent, or Firm—Christopher P. Malorana, P.C.

(57) ABSTRACT

A layout architecture for a programmable logic device comprising one or more adjacent metal lines, a first circuit, and a second circuit. The one or more adjacent metal lines may each comprise a critical path. The first circuit may be configured to present an input signal to each of the one or more adjacent metal lines in response to a configuration signal. The second circuit may be configured to (i) receive a signal from at least one of the one or more adjacent metal lines selected in response to the configuration signal and (ii) generate an output signal in response to the received signal.

19 Claims, 5 Drawing Sheets

PROGRAMMABLE NUMBER OF METAL LINES AND EFFECTIVE METAL WIDTH ALONG CRITICAL PATHS IN A PROGRAMMABLE LOGIC DEVICE

FIELD OF THE INVENTION

The present invention relates to a method and/or architecture for programmable logic devices generally and, more particularly, to a method and/or architecture for a programmable number of metal lines and effective metal width along a critical path in a programmable logic device.

BACKGROUND OF THE INVENTION

Referring to FIG. 1, a chart 10 illustrating a comparison between sources of delay in an integrated circuit (IC) is shown. The chart 10 is shown comprising three traces. A trace 12 illustrates overall device delay. A trace 14 illustrates a portion of the overall device delay from gate delay. A trace 16 illustrates a portion of the overall device delay from interconnect delay. Currently, gate delays are larger than interconnect delays as shown by a portion 18. For example, at a technology generation of 500 nm, the gate delay contribution is 4 times the interconnect delay as shown by a point 20. As technology generations decrease the scale of integrated circuits, gate delays and interconnect delays will, at some point, contribute equally to overall delay as shown by a point 22. However, as the technology generations continue to shrink the distances in ICs, the interconnect delays will become more of a concern than the gate delays as shown by a portion 24. For example, when the technology generation reaches 180 nm, the delay due to the gates will be only four-tenths the delay due to the interconnects as shown by a point 26.

The delay due to interconnects is of particular concern in a critical path of an integrated circuit. For best performance, the width of the metal lines along a critical path may need to change depending on the characteristics of the critical path. For example, in a microprocessor, a critical path signal is carried by a dedicated metal bus. The critical path of the microprocessor does not change. The metal width and parasitics of the metal bus can be optimized to meet performance requirements.

A programmable logic device (PLD) allows programmable logic to be implemented in an integrated circuit. Like most other ICs, a PLD has critical speed paths. However, the critical speed paths change depending upon the particular logic function implemented. In conventional PLDs, a critical path signal is carried by a single metal line. The particular metal line may be chosen from an array of metal lines depending on the logic function being implemented. Conventional PLDs have fixed metal line widths along the paths in the PLD. Area considerations prevent optimizing the widths of the metal lines to improve performance. The metal line width cannot be changed and optimized for a particular critical path.

Some characteristics of conventional PLDs have been optimized. For example, some software can choose more than one line (e.g., two lines), usually running in different directions, for load distribution.

As technology generations lead to interconnect delays dominating gate delays, a PLD architecture and/or programming software that may actively minimize interconnect delays is needed.

SUMMARY OF THE INVENTION

The present invention concerns a layout architecture for a programmable logic device comprising one or more adjacent metal lines, a first circuit, and a second circuit. The one or more adjacent metal lines may each comprise a critical path. The first circuit may be configured to present an input signal to each of the one or more adjacent metal lines in response to a configuration signal. The second circuit may be configured to (i) receive a signal from at least one of the one or more adjacent metal lines selected in response to the configuration signal and (ii) generate an output signal in response to the received signal.

The objects, features and advantages of the present invention include providing a method and/or architecture that may (i) minimize parasitics along a critical path, (ii) increase performance of a critical path, (iii) use a number of adjacent metal lines for a critical path, and/or (iv) provide a programmable effective metal width of a critical path.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
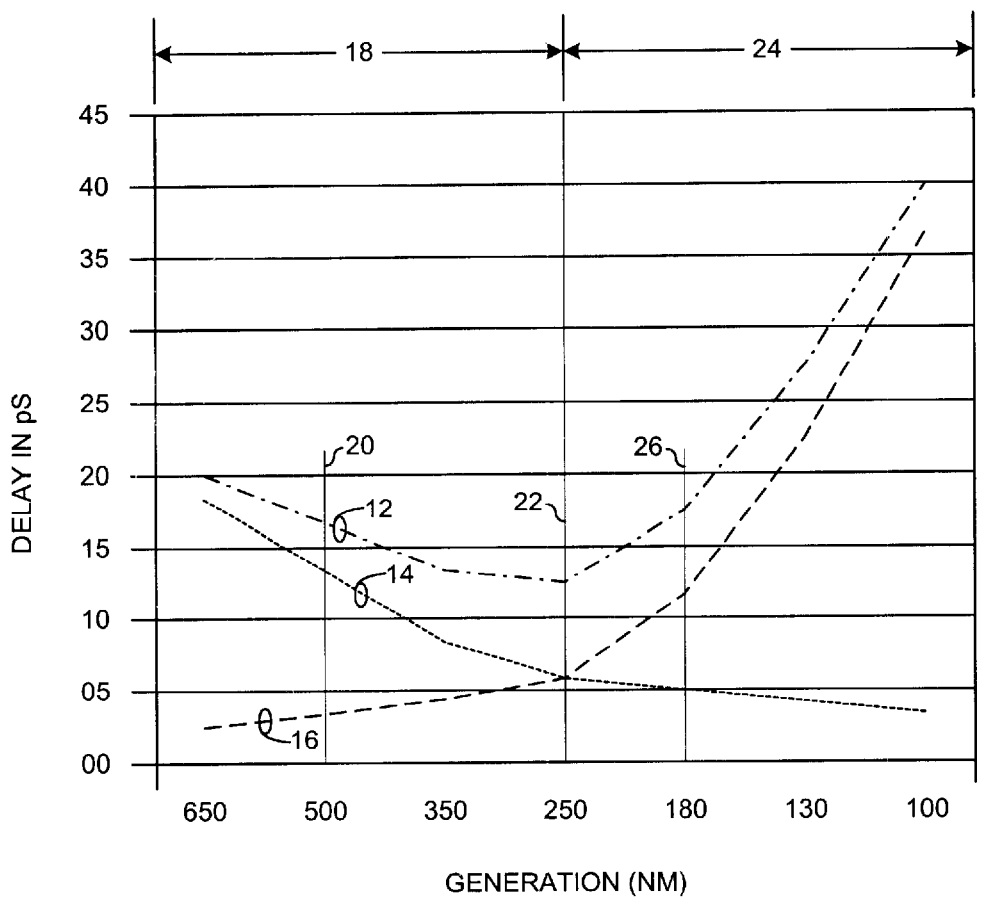
FIG. 1 is a diagram illustrating changes in performance characteristics with technology generations.
Figure 2:
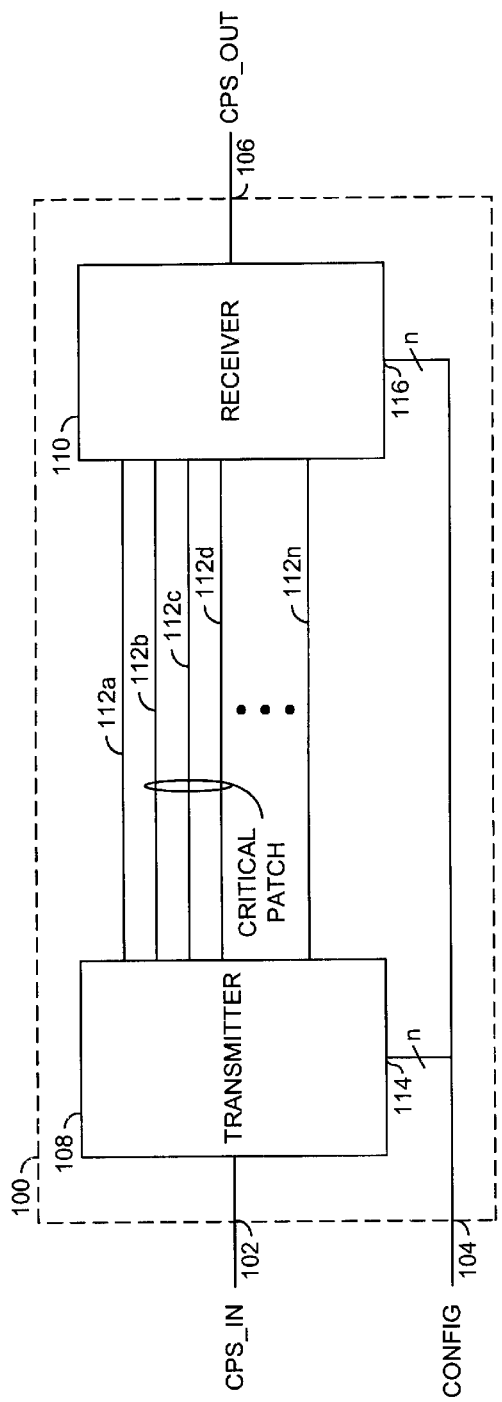
FIG. 2 is a block diagram illustrating a preferred embodiment of the present invention.

Referring to FIG. 2, a block diagram of a circuit 100 is shown in accordance with a preferred embodiment of the present invention. The circuit 100 may be implemented, in one example, as a critical path in a programmable logic device. The circuit 100 may illustrate a single critical path. However, other appropriate numbers of critical paths may be implemented in order to meet the criteria of a particular implementation. The circuit 100 may have an input 102 that may receive a signal (e.g., CPS_IN), an input 104 that may receive a configuration signal (e.g., CONFIG), and an output 106 that may present a signal (e.g., CPS_OUT). The signal CPS_OUT will generally be similar to the signal CPS_IN. The signal CONFIG may be N-bits wide, where N is an integer. The circuit 100 may provide a programmable effective metal line width of the critical path in response to the signal CONFIG. The signal CPS_OUT may be, in one example, a cleaner version of the signal CPS_IN than would be transmitted using a single metal line having a fixed width. The signal CPS_OUT may have a shorter propagation delay with respect to the signal CPS_IN than would be possible using a single metal line of fixed width.

The circuit 100 may comprise, in one example, a circuit 108, a circuit 110 and a plurality of metal lines 112a–112n. The signal CPS IN may be presented to the circuit 108. The signal CONFIG may be presented to an input 114 of the circuit 108 and an input 116 of the circuit 110. The circuit 108 may select, in one example, a number of adjacent lines from the plurality of lines 112a–112n in response to one or more bits of the signal CONFIG. The selected adjacent metal lines may be used to transmit the signal CPS_IN to the circuit 110. In one example, the circuit 108 may select the lines 112b, 112c and 112d to form the critical path along which the signal CPS_IN will be transmitted to the circuit 110. The remaining lines 112a and 112e–112n may be used to carry other signals in the Programmable Logic Device (PLD). However, other numbers of adjacent lines may be selected to meet the design criteria of a particular application.

The circuit 110 may use fewer lines than were selected by the circuit 108. For example, when an odd number of lines have been programmed to carry the signal CPS_IN, the circuit 110 will generally use the signal carried on a centermost line. When an even number of lines are programmed, the two innermost lines will generally present a similar signal. In the example above, the circuit 110 generally selects the metal line 112c from which to receive the signal CPS_IN in response to one or more bits of the signal CONFIG. The circuit 110 will generally present the signal CPS_OUT in response to the signal received from the selected one or more metal lines. The circuit 110 will generally select a metal line which is between the other selected metal lines. For example, if the circuit 108 has selected the metal lines 112b–112d, the circuit 110 will generally select the metal line 112c from which to receive the signal CPS IN.

Figure 3:
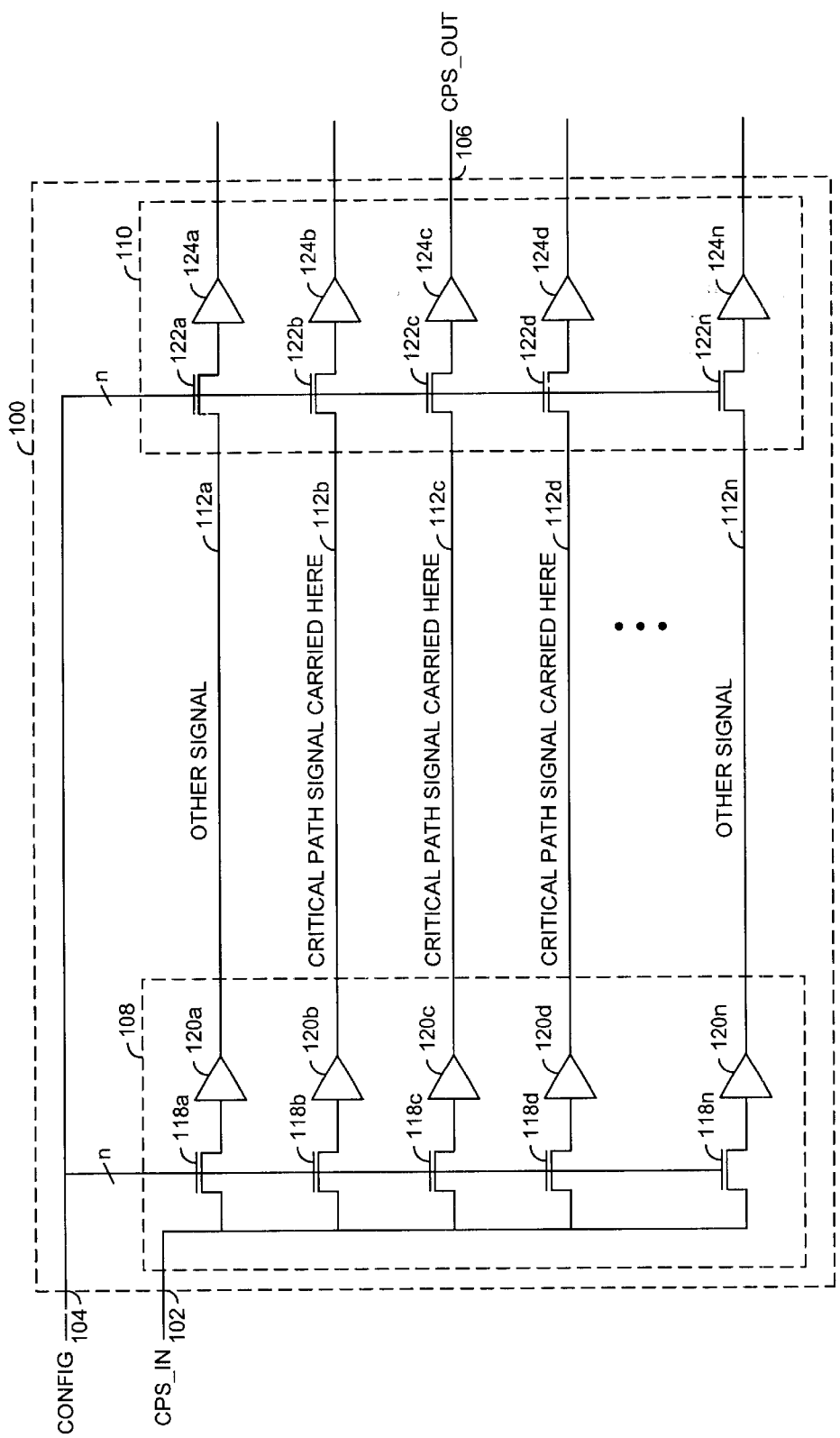
FIG. 3 is a detailed block diagram illustrating an implementation in accordance with the present invention.

Referring to FIG. 3, a more detailed block diagram of the circuit 100 is shown. The circuit 100 may comprise a plurality of programmable gates that may enable more than one metal line to make up the critical path. The circuit 108 may comprise, in one example, a plurality of transistors 118a–118n and a plurality of drivers 120a–120n. One or more bits of the signal CONFIG may be used to select which of the lines 112a–112n are presented the signal CPS_IN. The circuit 110 may similarly comprise a plurality of transistors 122a–122n and a plurality of drivers 124a–124n. One or more bits of the signal CONFIG may be used to select which of the signal pathways 112a–112n are connected to the drivers 124a–124n via the transistors 122a–122n. The transistors 118a–118n and 122a–122n may be implemented, in one example, as one or more NMOS transistors. However, other types and polarities of transistors may be implemented to meet the design criteria of a particular application. The circuit 110 may not necessarily use all the metal lines. The middle metal line is generally faster (e.g., the shortest propagation delay). In one example, signals carried by metal lines 112b and 112d may be blocked from the drivers 124b and 124d by turning off the transistors 122b and 122d. By using a number of adjacent metal lines, parasitics on the critical path may be reduced. The critical path signal carried on the middle line may arrive cleaner. The circuit 100 may be configured to combine an optimal number of metal lines to form the highest performance critical path.

Figure 4:
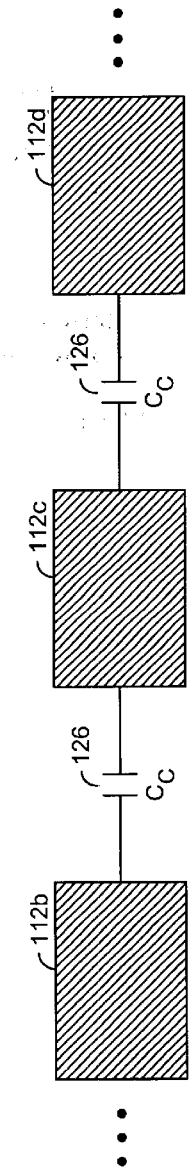
FIG. 4 is a diagram illustrating capacitive coupling between adjacent metal lines.

Referring to FIG. 4, a cross section of the metal lines 112b–112d is shown. The metal lines may be capacitively coupled as. illustrated by a capacitor 126 having a capacitance (e.g., C). By placing similar signals on adjacent metal lines, the circuit 100 may reduce the capacitance Cc between the adjacent lines thereby increasing the speed at which the signal can be transferred across the chip. The circuit 100 may also decrease the amount of noise added to a signal carried by the inner most metal lines (e.g., metal line 112c) of the adjacent metal lines 112b–112d. In addition, by having adjacent metal lines carry signals moving in the same direction as the critical path signal, the coupling capacitance (e.g., $C_c$) may be zeroed or minimized.

Figure 5:
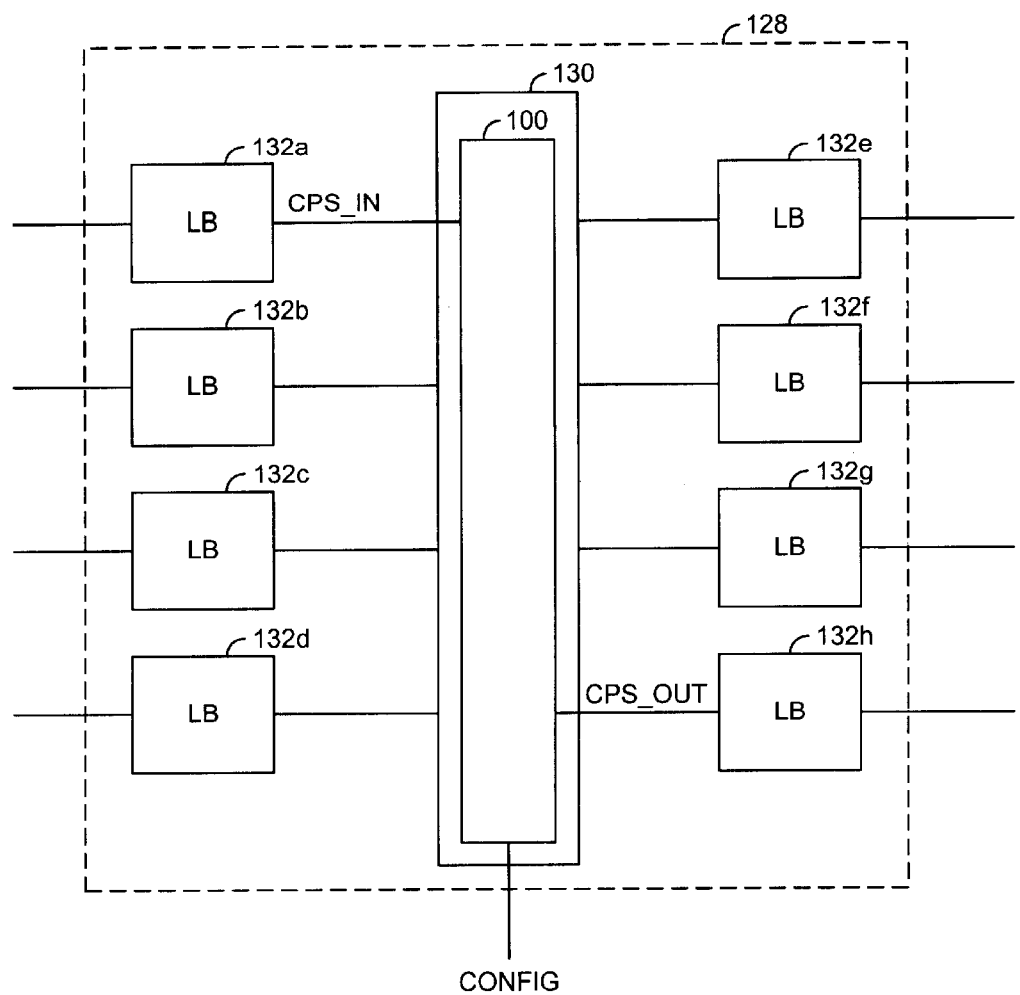
FIG. 5 is a diagram illustrating an application of the present invention.

Referring to FIG. 5, a block diagram of an application of the circuit 100 is shown. The circuit 100 is shown implemented in the context of a PLD 128. The circuit 100 may be implemented, in one example, in a programmable interconnect matrix (PIM) 130 of the PLD 128. The PLD 128 may comprise eight logic blocks 132a–132h. In one example, a critical path may run from the logic block 132a to the logic block 132h. The signal CPS_IN may be presented by the logic block 132a to the circuit 100. The circuit 100 may present the signal CPS_OUT to the logic block 132h in response to the signals CPS_IN and CONFIG.

Figure 6:
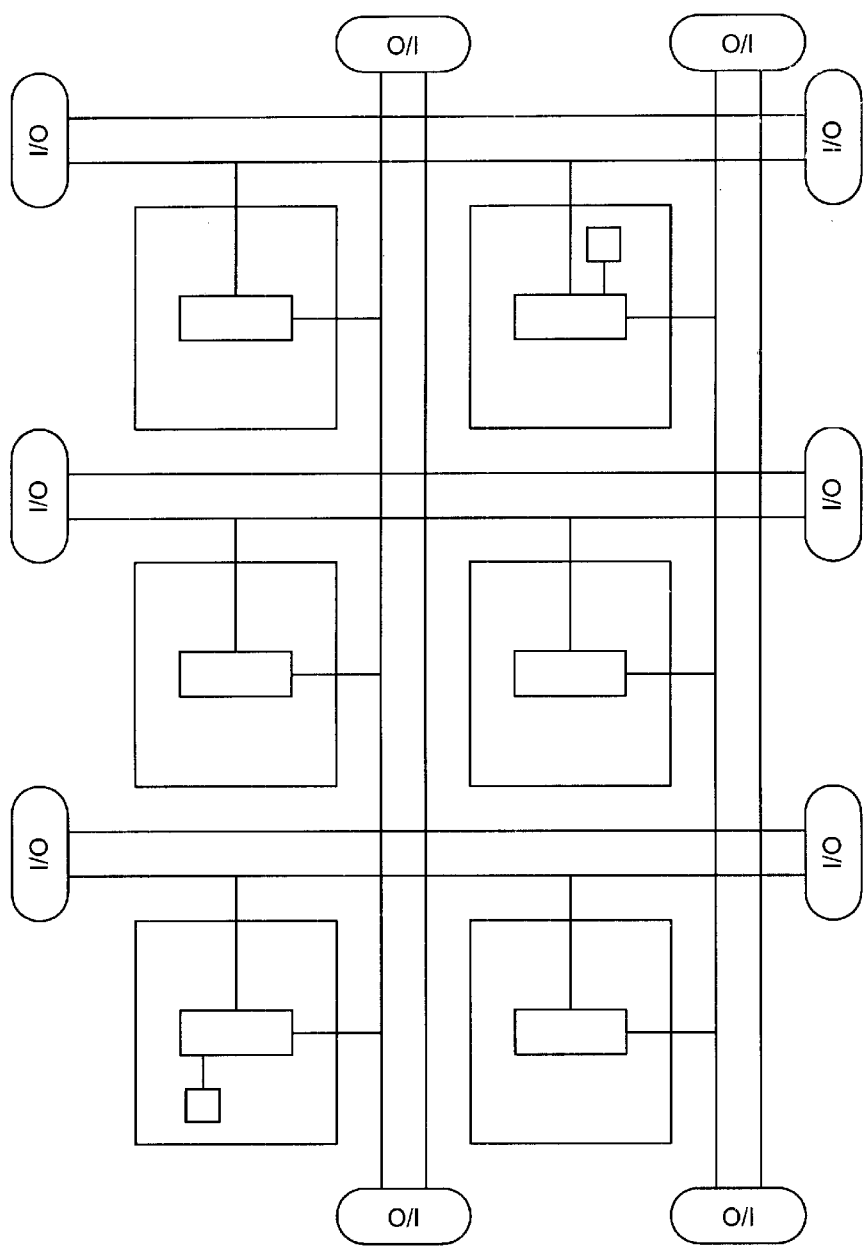
FIG. 6 is a diagram illustrating an alternative implementation of the present invention.

Referring to FIG. 6, a block diagram of an alternative implementation of the circuit 100 is shown. The circuit 100 may be implemented, in one example, using a programmable logic device architecture that may be found in a co-pending application, U.S. Ser. No. 09/475,879, filed Dec. 30, 1999, which is hereby incorporated by reference in its entirety. A PLD 134 may comprise a PIM 136, a PIM 138, and routing channels 140a–140b and 142a–142c. The circuit 108 may be implemented using the PIM 136. The circuit 110 may be implemented using the PIM 138. The metal lines 112a–112n may be implemented using the routing channels 140a–140b and 142a–142c.

The present invention provides a PLD architecture and programming software solution that may choose multiple adjacent metal lines to make up the critical path. The programming software may comprise an appropriate type computer readable medium in order to meet the criteria of a particular implementation. The use of multiple adjacent metal lines may provide optimal performance for a given logic function implemented in the PLD. By using multiple adjacent metal lines for a critical path, a PLD may be designed for optimal performance by using programmable elements to reduce parasitics along the critical path. A PLD implemented in accordance with the present invention provides not only programmable logic but also a programmable effective metal width of a critical path.

By using the programmable gates present in a PLD, the programming software may choose how many metal lines are along the critical path so that the effective width of the critical path may be changed and optimized. Changing and optimizing the critical path may improve the performance of the PLD.

While the invention has been particularly shown and described with reference to the preferred embodiments thereof, it will be understood by those skilled in the art that various changes in form and details may be made without departing from the spirit and scope of the invention.

What is claimed is:

1. A layout architecture for a programmable logic device comprising:

a plurality of adjacent metal lines comprising a critical path;

a first circuit coupled to said plurality of adjacent metal lines and configured to present an input signal to each of said plurality of adjacent metal lines in response to a configuration signal; and a second circuit coupled to said plurality of adjacent metal lines and configured to (i) receive said input signal from at least one of said plurality of adjacent metal lines selected in response to said configuration signal and (ii) generate an output signal in response to said received signal, wherein said plurality of adjacent metal lines is configured to reduce a capacitance between each of said plurality of adjacent metal lines.

2. The layout architecture according to claim 1, wherein said input signal comprises a critical path signal.

3. The layout architecture according to claim 1, wherein said first circuit comprises a plurality of programmable gate elements.

4. The layout architecture according to claim 1, wherein said first circuit comprises a programmable interconnect matrix.

5. The layout architecture according to claim 1, wherein said second circuit comprises a plurality of programmable gate elements.

6. The layout architecture according to claim 1, wherein said second circuit comprises a programmable interconnect matrix.

7. The layout architecture according to claim 1, wherein said layout architecture comprises a programmable interconnect matrix.

8. The layout architecture according to claim 1, wherein said first circuit is further configured to present said input signal to at least three adjacent metal lines in response to said configuration signal.

9. The layout architecture according to claim 1, wherein said first circuit is further configured to select at least three adjacent metal lines in response to programming software.

10. A method for providing a programmable effective metal line width in a programmable logic device comprising the steps of:
   (A) determining a critical path for said programmable logic device;
   (B) dedicating a plurality of adjacent metal lines along said critical path;
   (C) programming a first circuit to present an input signal to each of said plurality of adjacent metal lines of said critical path;
   (D) programming a second circuit to generate an output signal in response to a signal received from at least one of said plurality of adjacent metal lines; and
   (E) reducing a capacitance between each of said plurality of adjacent metal lines.

11. The method according to claim 10, wherein said input signal comprises a critical path signal.

12. The method according to claim 10, further comprising the step of:
   selecting a number of adjacent metal lines comprising said plurality of metal lines to reduce a propagation delay of said critical path.

13. The method according to claim 10, wherein step (B) further comprises selecting at least three adjacent metal lines for said critical path in response to a configuration signal.

14. The method according to claim 10, wherein step (B) further comprises selecting at least three adjacent metal lines for said critical path in response to programming software.

15. The method according to claim 10, further comprising the step of performed said steps (A)–(E) by using a computer readable medium including computer executable instructions.

16. A layout architecture for a programmable logic device comprising:
   a plurality of adjacent metal lines comprising a critical path;
   a first circuit coupled to said plurality of adjacent metal lines and configured to present an input signal to each of said plurality of adjacent metal lines in response to a configuration signal; and
   a second circuit coupled to said plurality of adjacent metal lines and configured to (i) receive said input signal from at least one of said plurality of adjacent metal lines selected in response to said configuration signal and (ii) generate an output signal in response to said received signal, wherein said plurality of adjacent metal lines is configured to provide a predetermined effective metal line width.

17. The apparatus according to claim 16 wherein said adjacent metal lines are further configured to reduce a capacitance between each of said adjacent metal lines.

18. The apparatus according to claim 17, wherein said adjacent metal lines are further configured to reduce a propagation delay of said input signal.

19. A layout architecture for a programmable logic device comprising:
   a plurality-of adjacent metal lines comprising a critical path;
   a first circuit coupled to said plurality of adjacent metal lines and configured to present an input signal to each of said plurality of adjacent metal lines in response to a configuration signal; and
   a second circuit coupled to said plurality of adjacent metal lines and configured to (i) receive said input signal from at least one of said plurality of adjacent metal lines selected in response to said configuration signal and (ii) generate an output signal in response to said received signal, wherein said plurality of adjacent metal lines is configured to reduce a propagation delay of said input signal.

* * * * *